(12) United States Patent
Mori

(10) Patent No.: US 9,343,343 B2
(45) Date of Patent: May 17, 2016

(54) METHOD FOR REDUCING PARTICLE GENERATION AT BEVEL PORTION OF SUBSTRATE

(71) Applicant: ASM IP Holding B.V., Almere (NL)

(72) Inventor: Yukihiro Mori, Machida (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/281,477

(22) Filed: May 19, 2014

(65) Prior Publication Data

US 2015/0332949 A1     Nov. 19, 2015

(51) Int. Cl.
| | |
|---|---|
| *H01L 23/31* | (2006.01) |
| *H01L 21/677* | (2006.01) |
| *H01L 21/67* | (2006.01) |
| *C23C 16/50* | (2006.01) |
| *H01J 37/32* | (2006.01) |
| *B25J 11/00* | (2006.01) |
| *C23C 16/04* | (2006.01) |
| *C23C 16/458* | (2006.01) |

(52) U.S. Cl.
CPC ....... *H01L 21/67742* (2013.01); *B25J 11/0095* (2013.01); *C23C 16/04* (2013.01); *C23C 16/4585* (2013.01); *C23C 16/50* (2013.01); *H01J 37/32532* (2013.01); *H01J 37/32541* (2013.01); *H01L 21/67011* (2013.01); *H01L 23/3171* (2013.01); *H01L 23/3185* (2013.01)

(58) Field of Classification Search
CPC .. H01L 23/3171; H01L 23/3185; H01L 21/20
See application file for complete search history.

(56) References Cited

U.S. PATENT DOCUMENTS

2013/0005122 A1*   1/2013   Schwarzenbach   H01L 21/76251
                                                                     438/479

* cited by examiner

*Primary Examiner* — Phat X Cao
(74) *Attorney, Agent, or Firm* — Snell & Wilmer LLP

(57) ABSTRACT

A method for transporting a substrate using an end effector which mechanically clamps a periphery of the substrate includes: before transporting the substrate, depositing a compressive film only on, at, or in a bevel portion of the substrate; and transporting the substrate whose bevel portion is covered by the compressive film as the outermost film, using an end effector while mechanically clamping the periphery of the substrate.

3 Claims, 7 Drawing Sheets

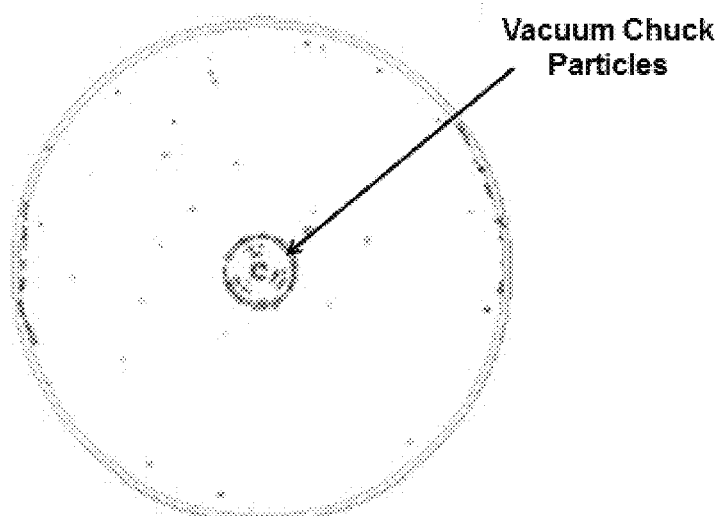
Fig. 7
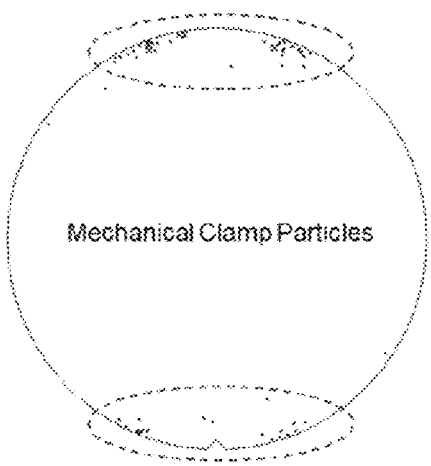 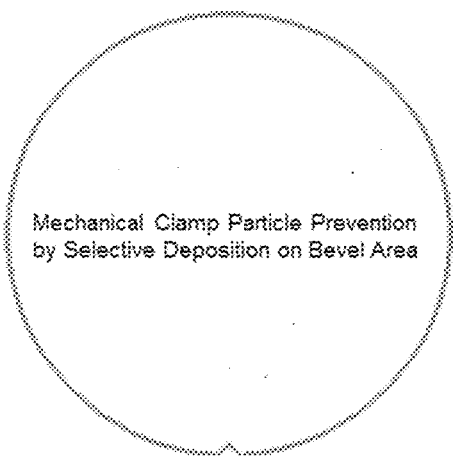
Fig. 8(a)  Fig. 8(b)

METHOD FOR REDUCING PARTICLE GENERATION AT BEVEL PORTION OF SUBSTRATE

BACKGROUND OF THE INVENTION

1. Field of the Invention

The present invention generally relates to transportation of a substrate using an end effector which mechanically clamps the periphery of the substrate, in particular, to a method for reducing particle generation at a bevel portion of the substrate during the transportation.

2. Description of the Related Art

In semiconductor or liquid crystal display (LCD) manufacturing, micro particle generation which occurs at substrate edges is a serious concern. Micro particles are generated when the edge of a substrate such as a Si wafer is scratched by a clamping device of a substrate transfer robot to mechanically clamp the edge of the substrate. Also, when a film deposited on a substrate edge surface is scratched by a clamp and partially peeled, micro particles are generated. This problem most likely occurs when the film having tensile mechanical stress ("tensile film") is deposited on the substrate surface, which film easily peels off from the substrate surface. After these particles generated at the edge of the substrate are detached from the substrate surface, they move over the surface and adhere to the substrate surface, causing electrical damage to a highly integrated circuit and leading to serious yield reduction.

In order to prevent particle generation by mechanical clamping at the edge of a substrate, a vacuum chuck for a substrate backside surface is well-known means. However, this device cannot be adapted to transfer a substrate under a vacuum environment. In addition, when a substrate is transported using a vacuum chuck, particles are generated in an area where the vacuum chuck is attached, giving rise to a concern on accuracy of the subsequent processes such as a lithography process since particles on the substrate backside may shift the focal point by a micron order when patterning is performed using an exposure device. FIG. 7 shows particles on the backside of a substrate after the substrate was aligned using a notch aligner of vacuum chuck type wherein a vacuum chuck was attached at the center of the substrate (the diameter of the suction area was about 40 mm, and suction pressure was 60 to 80 kPa less than the standard atmospheric pressure). For these reasons, the vacuum chuck method does not meet the requirements for highly integrated modern semiconductor manufacturing. Other than the vacuum chuck, simply slowing down the substrate transfer speed without using any chuck devices is an often used option. This measure, however, increases the overall substrate transfer time and leads to a serious problem of low productivity.

Any discussion of problems and solutions in relation to the related art has been included in this disclosure solely for the purposes of providing a context for the present invention, and should not be taken as an admission that any or all of the discussion was known at the time the invention was made.

SUMMARY OF THE INVENTION

Some embodiments provide a method to reduce micro particles generated by mechanical clamping or contact when clamping a substrate edge for transfer. In some embodiments, particle generation at the edge of a substrate is inhibited by depositing a film having high mechanical strength by generating a plasma only over the substrate edge area (bevel portion) which has no influence on the device processing area of the substrate. Typically, depositing a film having high mechanical strength on the bevel portion can cancel mechanical stress generated in the underlying layers. The deposition can be accomplished in a single step performed selectively and exclusively on the edge area (bevel portion), thereby inhibiting particle generation caused by edge clamping or mechanical contact during subsequent substrate transfer steps.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 7 illustrates particle distribution on the backside of a substrate after the substrate was aligned using a notch aligner of vacuum chuck type wherein a vacuum chuck was attached at the center of the substrate.

FIG. 8(a) illustrates a particle distribution on the backside of a substrate after the substrate is transferred using a mechanical clamp, wherein the bevel portion of the substrate is not treated.

FIG. 8(b) illustrates a particle distribution on the backside of a substrate after the substrate is transferred using a mechanical clamp, wherein the bevel portion of the substrate is treated according to an embodiment of the present invention.

DETAILED DESCRIPTION OF EMBODIMENTS

Figure 1:
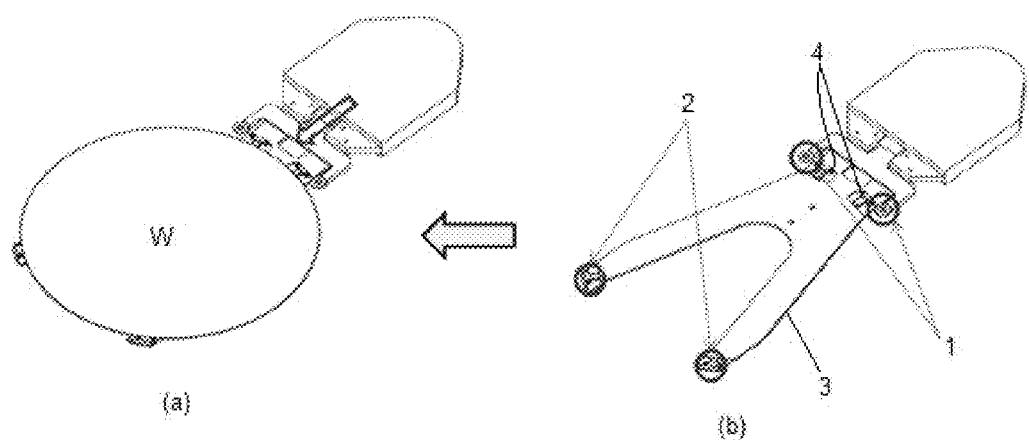
FIG. 1 consists of two schematic perspective views ((a) and (b)) illustrating a method of edge clamping usable in an embodiment of the present invention.

In this disclosure, "gas" may include vaporized solid and/or liquid and may be constituted by a single gas or a mixture of gases. Likewise, an article "a" or "an" refers to a species or a genus including multiple species. In this disclosure, a process gas introduced to a reaction chamber through a showerhead or a gas nozzle may be comprised of, consist essentially of, or consist of a silicon-containing precursor and an additive gas. The additive gas includes a gas for oxidizing and/or nitriding the precursor when RF power is applied to the additive gas. The precursor and the additive gas can be introduced as a mixed gas or separately to a reaction space. The precursor can be introduced with a carrier gas such as a rare gas. A gas other than the process gas, i.e., a gas introduced without passing through the showerhead, may be used for, e.g., sealing the reaction space, which includes a seal gas such as a rare gas. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. Additionally, the term "constituted by" refers to "comprising", "consisting essentially of", or "consisting of" in some embodiments. In this disclosure, any defined meanings do not necessarily exclude ordinary and customary meanings in some embodiments.

Further, in this disclosure, any two numbers of a variable can constitute a workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation. In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

Embodiments will be explained with respect to preferred embodiments. However, the present invention is not intended to be limited to the preferred embodiments.

Some embodiments of the present invention provide a method for transporting a substrate using an end effector which mechanically clamps a periphery of the substrate, comprising: (i) before transporting the substrate, depositing a compressive film only on, at, or in a bevel portion of the substrate; and (ii) transporting the substrate whose bevel portion is covered by the compressive film as the outermost film, using an end effector while mechanically clamping the periphery of the substrate. Since the compressive film protects the bevel portion of the substrate, generation of particles by edge clamping or contact can effectively be suppressed. The compressive film is a film having compressive mechanical stress and is deposited only on, at, or in the bevel portion of the substrate so that the film does not substantially affect the device processing area of the substrate. In some embodiments, the compressive film does not extend to the device processing area of the substrate. As long as the film does not substantially affect the device processing area of the substrate, immaterial or an unsubstantial amount of film can be deposited in the device processing area.

In some embodiments, the compressive film is deposited on an area of the bevel portion where a clamping device of the end effector makes contact during the transportation. When the area of contact with the clamping device is fully covered or protected by the compressive film, generation of particles can effectively be inhibited. That is, an area other than the area of contact need not be covered by the compressive film. Alternatively, the compressive film is deposited over the entire bevel portion along the periphery of the substrate.

In some embodiments, the compressive film has a maximum thickness of about 10 nm to about 1,000 nm, typically about 50 nm to about 500 nm.

In some embodiments, the compressive film is a silicon nitride film, silicon oxide film, or silicon oxynitride film. In other embodiments, any suitable compressive film such as aluminum oxide film having sufficient mechanical strength can be used. In some embodiments, the compressive film has a compressive stress of about 50 MPa to about 1,000 MPa, typically about 100 MPa to about 500 MPa. The stress of a ring-shaped film can be measured as a wrapping direction and degree of a substrate after a film is deposited under the same conditions on the entire surface of the substrate at a thickness of about 200 nm to about 1,000 nm.

In some embodiments, the substrate has a tensile film deposited thereon in an area between the bevel portion and a center of the substrate. A tensile film is often deposited as a dielectric film on a substrate. However, since a tensile film has a stress directed to separate away from the substrate surface, the tensile film easily peels off from the substrate surface even by slight mechanical contact (such as by a clamp of an end effector). However, when the compressive film is formed along the bevel portion of the substrate, since compressive stress is directed to press the film down toward the substrate surface, the tensile stress of the underlying tensile film can be canceled out by the compressive stress of the compressive film at the bevel portion (also referred to as "compressive bevel film"), inhibiting separation of the film when mechanical contact occurs. When the compressive stress of the compressive bevel film is greater than the tensile stress of the underlying film, the film at the bevel portion becomes more stable and resists separation from the substrate surface when mechanical contact occurs at the bevel portion of the substrate, thereby significantly reducing generation of particles. Thus, the compressive bevel film is advantageous especially when the underlying film is a tensile film, although no particular limitation is imposed on the type of underlying film. The underlying film may be amorphous carbon, amorphous Si, carbon-doped oxide low-k, and TiN films, for example.

Figure 10:
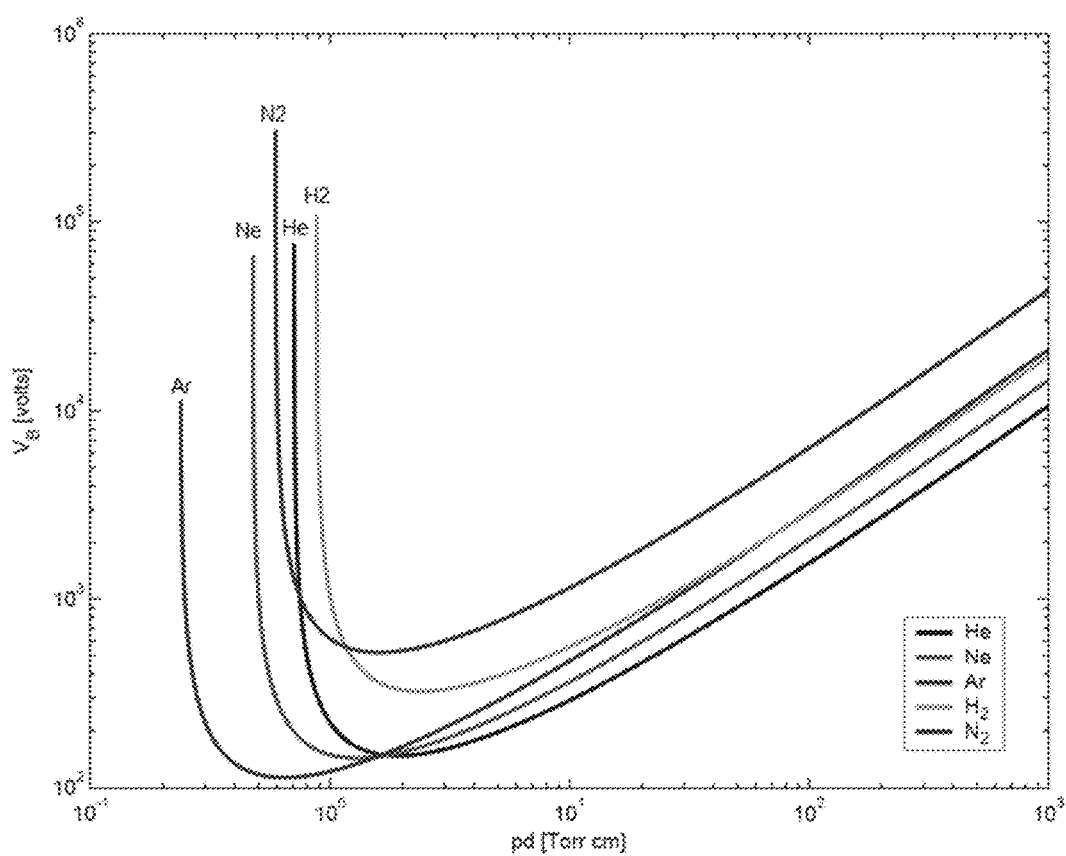
FIG. 10 shows Paschen's curves illustrating the relationship between p·d (p: chamber pressure, d: a distance between electrodes) and $V_B$ (breakdown voltage) in relation to the types of gas according to Paschen's law (from Wikipedia).

In some embodiments, the step of depositing the compressive film comprises loading the substrate between upper and lower electrodes which are arranged so that a plasma is generated only over or at the bevel portion of the substrate; and applying RF power to the electrodes so as to deposit the compressive film only on, at, or in the bevel portion of the substrate. By generating a plasma location-selectively over the bevel portion of a substrate, a compressive bevel film can be deposited location-selectively on, at, or in the bevel portion of the substrate. In order to achieve location-selective plasma generation, in some embodiments, a distance between the upper and lower electrodes over or at the bevel portion of the substrate is set for generating a plasma, whereas a distance between the upper and lower electrodes over an area of the substrate between the bevel portion and the center of the substrate is too great or too small for generating a plasma. According to Paschen's law, a breakdown voltage (here plasma ignition voltage) changes as a function of the product of chamber pressure and a distance between electrodes. Thus, by adjusting the distance between the upper and lower electrodes, plasma ignition voltage can be adjusted, i.e., deposition of a film can be controlled. FIG. 10 shows Paschen's curves illustrating the relationship between p·d (p: chamber pressure, d: a distance between electrodes) and $V_B$ (breakdown voltage) in relation to the types of gas according to Paschen's law (from Wikipedia). Accordingly, there is a particular range of the distance between the upper and lower electrodes where ignition voltage is low (i.e., a plasma is easily generated), and when the distance between the upper and lower electrodes is too small or great, ignition voltage becomes high (i.e., a plasma is hardly generated). Thus, when the distance between the upper and lower electrodes at the bevel portion of the substrate is set for readily igniting a plasma (i.e., depositing a film), and the distance between the upper and lower electrodes between the bevel portion and the center of the substrate is set for preventing ignition of a plasma (i.e., suppressing deposition of a film), a compressive bevel film can be formed. The distance between the upper and lower electrodes at the bevel portion of the substrate can be optimized according to the type of gas and the pressure of the chamber. A skilled artisan will be able to determine the adequate distance according to Paschen's curves as a matter of routine experimentation based on this disclosure.

In some embodiments, the upper electrode is ring-shaped and set over or at the bevel portion of the substrate. In the above embodiments, simply by adjusting the distance between the ring-shaped upper electrode and the lower electrode (which can also be ring-shaped and installed along an insulation plate), a compressive bevel film can be formed.

In some embodiments, a compressive bevel film can be formed under the following conditions:

TABLE 1

(the numbers are approximate)

| | |
|---|---|
| Precursor | $SiH_4$, TEOS, etc., singly or in combination, at a flow rate of 50-500 sccm |
| Additive gas | $NH_3$, $N_2$, $N_2O$, $O_2$, etc., singly or in combination, at a flow rate of 500 sccm or more |
| Inert gas | He, Ar, etc., singly or in combination, at a flow rate of 200 sccm or more |
| Process temperature | 200 to 500° C. |
| Process pressure | 100 to 1,000 Pa |
| Process duration | 5 to 50 seconds |
| RF power | 0.5 to 5.0 W/cm$^2$ (W per cm$^2$ of effective area of upper electrode facing lower electrode and contributing to generation of plasma) |

For silicon nitride film or silicon oxide film, when the density increases, the film stress changes from tensile to compressive, and the higher the density, the higher the compressive stress becomes. Almost all film deposition parameters affect the film density. In order to increase the film density (increase compressive stress), the following changes may be employed: reducing precursor flow, increasing purge gas flow and inert gas flow, increasing deposition temperature, decreasing deposition pressure, increasing RF power, performing one or more of the above.

Gases can be introduced into a chamber through a showerhead, but alternatively, gases can be introduced through a gas nozzle or nozzles arranged at or near a center of the upper electrode, for example, in a manner such that gas flows outwardly in a radial direction, since a compressive bevel film does not require high uniformity (for example, a film thickness uniformity of ±10% is acceptable, whereas that of ±2% is a standard for a regular film on a substrate).

A substrate having a compressive bevel film can be transported using an end effector while suppressing generation of particles. Thus, in some embodiments, the end effector clamps the periphery of the substrate wherein the substrate is placed between front protrusions and push rollers provided near rear protrusions of the end effector, and the push rollers push the periphery of the substrate toward the front protrusions. Once the compressive bevel film is formed at the bevel portion of the substrate, any subsequent steps which may cause the bevel portion to mechanically contact a clamp or the like can also be performed while suppressing generation of particles. On the other hand, before the compressive bevel film is formed, the bevel portion of a substrate may easily be scratched, and thus, the substrate needs to be slowly transferred while being loaded on an end effector without a clamp.

In another aspect, some embodiments provide a method for reducing particle generation from a bevel portion of a substrate while transporting the substrate using an end effector which mechanically clamps a periphery of the substrate, comprising, before transporting the substrate, depositing a compressive film only on, at, or in a bevel portion of the substrate.

In still another aspect, some embodiments provide an apparatus for plasma-enhanced CVD, comprising: upper and lower electrodes, between which a substrate is loaded, said upper and lower electrodes being arranged so that a plasma is generated only over or at a bevel portion of the substrate. Typically, a chamber provided with the upper and lower electrodes is a different chamber from a process chamber, and is designated for the bevel treatment where regular processing such as deposition of a film on the device processing area of a substrate cannot be performed. The designated chamber can be attached to a wafer-handling chamber (WHC) to which process chambers and load lock chambers are also attached, so that bevel treatment according to embodiments of the present invention can be continuously performed without being exposed to the open air.

In some embodiments, a distance between the upper and lower electrodes over or at the bevel portion of the substrate is set for generating a plasma, whereas a distance between the upper and lower electrodes over an area of the substrate between the bevel portion and the center of the substrate is too great or too small for generating a plasma. Alternatively, in some embodiments, the upper electrode is ring-shaped and set over or at the bevel portion of the substrate.

Embodiments will be explained with reference to the drawings. However, the present invention is not intended to be limited to the drawings.

FIG. 1 consists of two schematic perspective views ((a) and (b)) illustrating a method of edge clamping usable in an embodiment of the present invention. A substrate W is transferred using an end effector 3, wherein the end effector 3 clamps the periphery of the substrate W wherein the substrate W is placed between front protrusions 2 and push rollers 1 provided near rear protrusions 4 of the end effector 3 as illustrated in (b), and the push rollers 1 push the periphery of the substrate W toward the front protrusions 2 as illustrated in (a). By the edge clamping, the substrate W is clamped on the end effector while being transported. Since the bevel portion of the substrate is protected by the compressive bevel film, the edge clamping generates substantially no particles or an insignificant amount of particles. The substrate with the compressive bevel film can be transported by any suitable end effectors which use the bevel portion for clamping, other than that illustrated in FIG. 1.

Figure 2:
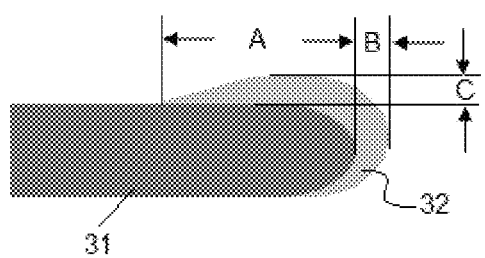
FIG. 2 is a schematic section view of a bevel portion of a substrate according to an embodiment of the present invention.

FIG. 2 is a schematic section view of a bevel portion of a substrate according to an embodiment of the present invention. The bevel portion is a portion of a substrate, which includes an edge area including an inclined area adjacent to the edge of the substrate, and which is not part of the device processing area of the substrate. A compressive bevel film 32 is formed only on, at, or in the bevel portion of a substrate 31 or only in an area generally defined as the bevel portion as illustrated in FIG. 2. In some embodiments, a thickness C of the bevel film 32, which is the highest point of the film from a top surface of the substrate 31 in a vertical direction, is about 10 nm to about 1,000 nm, typically about 50 nm to about 500 nm, a thickness B of the bevel film 32, which is the thickest point from the tip of the substrate 31 in a horizontal direction, is about the same as the thickness C, and a length A of the bevel film 32, which is a distance between the tip of the substrate 31 and the most inner point of the bevel film in a horizontal direction, is about 1 mm to 10 mm, typically about 2 mm to 5 mm. In general, the thickness of the substrate 31 is about 750 μm to about 800 μm. As illustrated in FIG. 2, in some embodiments, the bevel film 32 is formed on the upper and lower inclined areas near the tip of the substrate 31 so that the bevel portion is fully protected from edge clamping. The thickness of the bevel film is gradually decreased toward the center of the substrate, and the average thickness of the bevel film on the top surface of the substrate may be a half of the thickness C.

The compressive bevel film can be formed by the following method or any other suitable methods.

Figure 3:
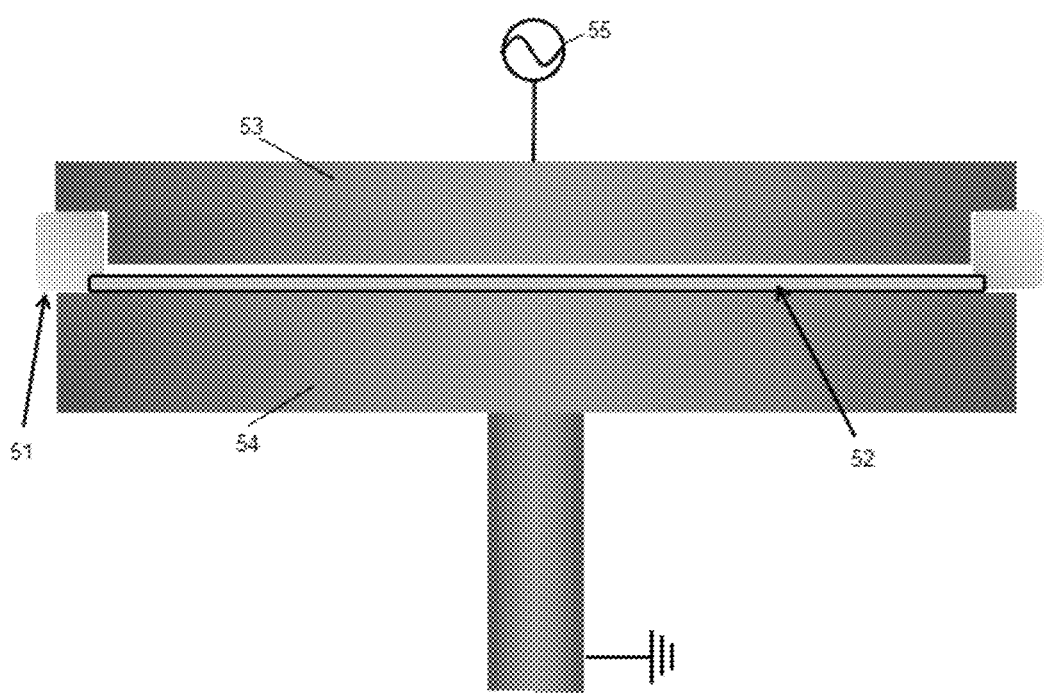
FIG. 3 is a schematic section view of electrodes treating a substrate according to an embodiment of the present invention.

FIG. 3 is a schematic section view of electrodes treating a substrate according to an embodiment of the present invention. The electrodes are contained in a chamber which is not shown. A substrate 52 (such as a Si wafer with or without an underlying film) is placed on a lower electrode 54, under an upper electrode 53. RF power is applied from an RF power source 55 to the upper electrode 53, and the lower electrode is grounded (alternatively, RF power can be applied to the lower electrode while the upper electrode is grounded). The upper electrode 53 has an outer recess at the periphery of the upper electrode 53 so that a distance between the upper electrode 53 and the lower electrode 54 at the periphery of the upper electrode 53 is greater than that in an area surrounded by the outer recess. Due to the above structure, a plasma 51 is generated only or predominately along the periphery of the substrate. The outer recess is designed so as to location-selectively generate the plasma 51 as illustrated in FIG. 3.

Figure 5:
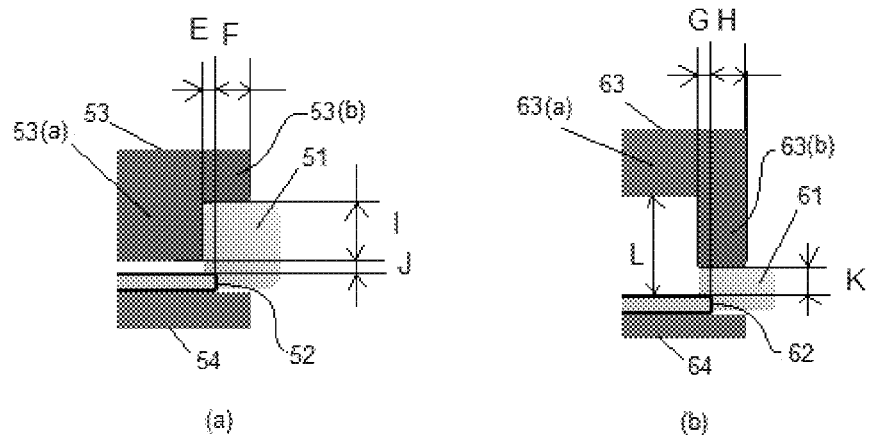
FIG. 5 consists of (a) an enlarged schematic section view at the bevel portion of the substrate illustrated in FIG. 3, and (b) an enlarged schematic section view at the bevel portion of the substrate illustrated in FIG. 4.

FIG. 5 (a) is an enlarged schematic section view at the bevel portion of the substrate illustrated in FIG. 3. In some embodiments, in order to form the compressive bevel film as illustrated in FIG. 2 according to Paschen's curves shown in FIG. 10, a distance J, which is a distance between a lower face of an inner portion 53(a) of the upper electrode 53 and a top surface of the substrate 52 is about 2 mm or less, a distance I, which is a distance between a lower face of a periphery portion 53(b) of the upper electrode 53 and the lower face of the inner portion 53(a) of the upper electrode 53 is about 5 mm to about 30 mm, a distance E, which is a distance between a periphery face of the inner portion 53(a) of the upper electrode 53 and the periphery of the substrate 52 is about 4 mm or less, and a distance F, which is a distance between the periphery of the substrate 52 and a periphery face of the periphery portion 53(b) of the upper electrode 53 is about 5 mm or more, so that the plasma 51 is confined in a region around the bevel portion of the substrate 52. The periphery of the upper electrode 53 is matched with the periphery of the lower electrode 54. Gas may be introduced through a gas nozzle disposed at the center of the upper electrode and flow radially toward the peripheries of the upper and lower electrodes. A skilled artisan will appreciate that the apparatus includes one or more controller(s) (not shown) programmed or otherwise configured to cause the deposition process described elsewhere herein to be conducted. The controller(s) are communicated with the various power sources, heating systems, pumps, robotics and gas flow controllers or valves of the reactor, as will be appreciated by the skilled artisan.

Figure 4:
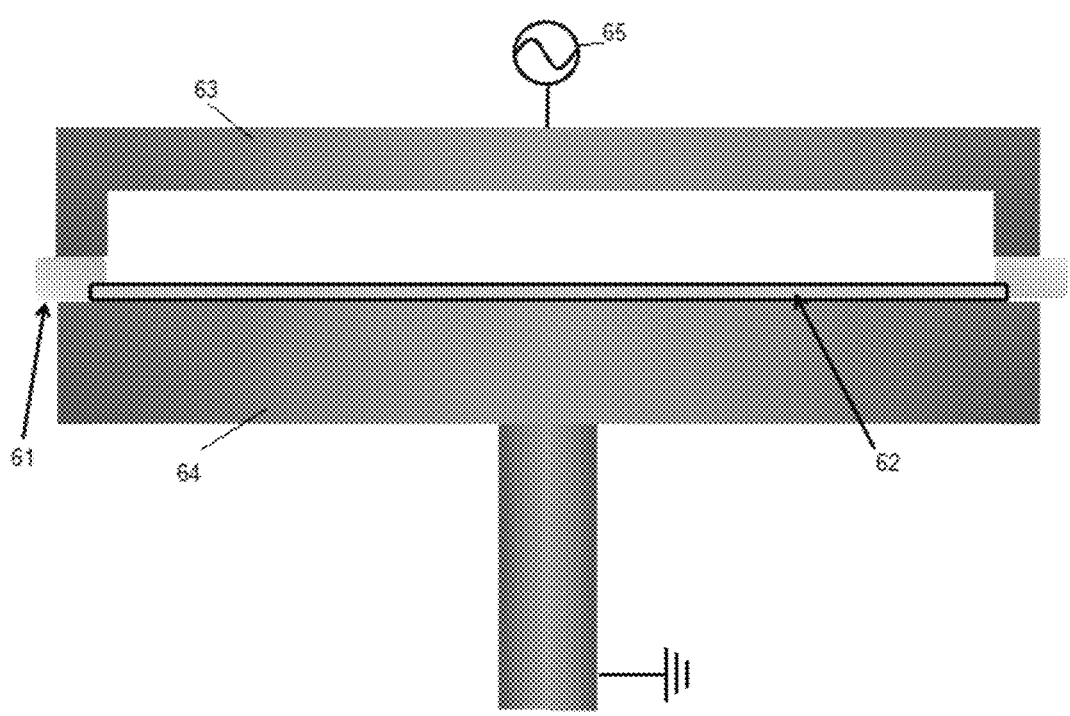
FIG. 4 is a schematic section view of electrodes treating a substrate according to another embodiment of the present invention.

FIG. 4 is a schematic section view of electrodes treating a substrate according to another embodiment of the present invention. The electrodes are contained in a chamber which is not shown. A substrate 62 (such as a Si wafer with or without an underlying film) is placed on a lower electrode 64, under an upper electrode 63. RF power is applied from an RF power source 65 to the upper electrode 63, and the lower electrode is grounded (alternatively, RF power can be applied to the lower electrode while the upper electrode is grounded). The upper electrode 63 has an inner recess surrounded by the periphery of the upper electrode 63 so that a distance between the upper electrode 63 and the lower electrode 64 at the periphery of the upper electrode 63 is smaller than that in an area of the inner recess. Due to the above structure, a plasma 61 is generated only or predominately along the periphery of the substrate. The inner recess is designed so as to location-selectively generate the plasma 61 as illustrated in FIG. 4.

FIG. 5 (b) is an enlarged schematic section view at the bevel portion of the substrate illustrated in FIG. 4. In some embodiments, in order to form the compressive bevel film as illustrated in FIG. 2 according to Paschen's curves shown in FIG. 10, a distance L, which is a distance between a lower face of an inner portion 63(a) of the upper electrode 63 and a top surface of the substrate 62 is about 50 mm or more, a distance K, which is a distance between a lower face of a periphery portion 63(b) of the upper electrode 63 and the top surface of the substrate 62 is about 5 mm to about 30 mm, a distance G, which is a distance between an inner face of the periphery portion 63(b) of the upper electrode 63 and the periphery of the substrate 62 is about 4 mm or less, and a distance H, which is a distance between the periphery of the substrate 62 and a periphery face of the periphery portion 63(b) of the upper electrode 63 is about 5 mm or more, so that the plasma 61 is confined in a region around the bevel portion of the substrate 62. The periphery of the upper electrode 63 is matched with the periphery of the lower electrode 64. Gas may be introduced through a gas nozzle disposed at the center of the upper electrode and flow radially toward the peripheries of the upper and lower electrodes. A skilled artisan will appreciate that the apparatus includes one or more controller(s) (not shown) programmed or otherwise configured to cause the deposition process described elsewhere herein to be conducted. The controller(s) are communicated with the various power sources, heating systems, pumps, robotics and gas flow controllers or valves of the reactor, as will be appreciated by the skilled artisan.

Figure 6:
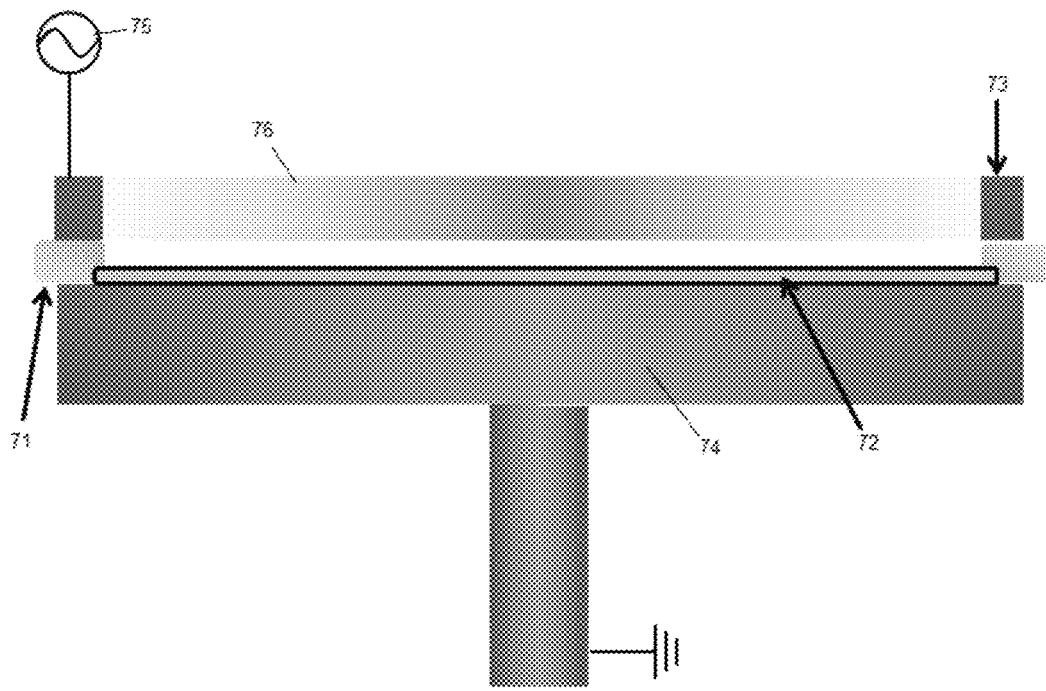
FIG. 6 is a schematic section view of electrodes treating a substrate according to another embodiment of the present invention.

FIG. 6 is a schematic section view of electrodes treating a substrate according to another embodiment of the present invention. The electrodes are contained in a chamber which is not shown. A substrate 72 (such as a Si wafer with or without an underlying film) is placed on a lower electrode 74, under an upper plate constituted by an insulation plate 76 surrounded by a ring-shaped upper electrode 73. RF power is applied from an RF power source 75 to the upper electrode 73, and the lower electrode is grounded (alternatively, RF power can be applied to the lower electrode while the upper electrode is grounded). The upper electrode 73 is ring-shaped so that a distance between the upper electrode 73 and the lower electrode 74 at the periphery of the upper electrode 73 is set for generating a plasma. Due to the above structure, a plasma 71 is generated only or predominately along the periphery of the substrate. The ring shape of the upper electrode 73 is designed so as to location-selectively generate the plasma 71 as illustrated in FIG. 6.

EXAMPLE

A compressive bevel film (silicon nitride film) is formed on a substrate (Φ300 mm) having an underlying film (amorphous carbon) by PECVD under the conditions shown below using the PECVD apparatus illustrated in FIG. 3, wherein a distance between the upper and lower electrodes is 15 mm at the peripheries of the upper and lower electrodes, and 1.5 mm in an inner area surrounded by the peripheries. The maximum thickness of the bevel film is 50 nm.

TABLE 2

(the numbers are approximate)

| | |
|---|---|
| Precursor | $SiH_4$ at a flow rate of 100 sccm |
| Additive gas | $NH_3$ at a flow rate of 500 sccm |
| Inert gas | $N_2$ at a flow rate of 5,000 sccm, and He at a flow rate of 500 sccm |
| Process temperature | 380° C. |
| Process pressure | 400 Pa |
| Process duration | 8 seconds |
| RF power | 13.56 MHz at 600 W and 400 kHz at 400 W |

Figure 9:
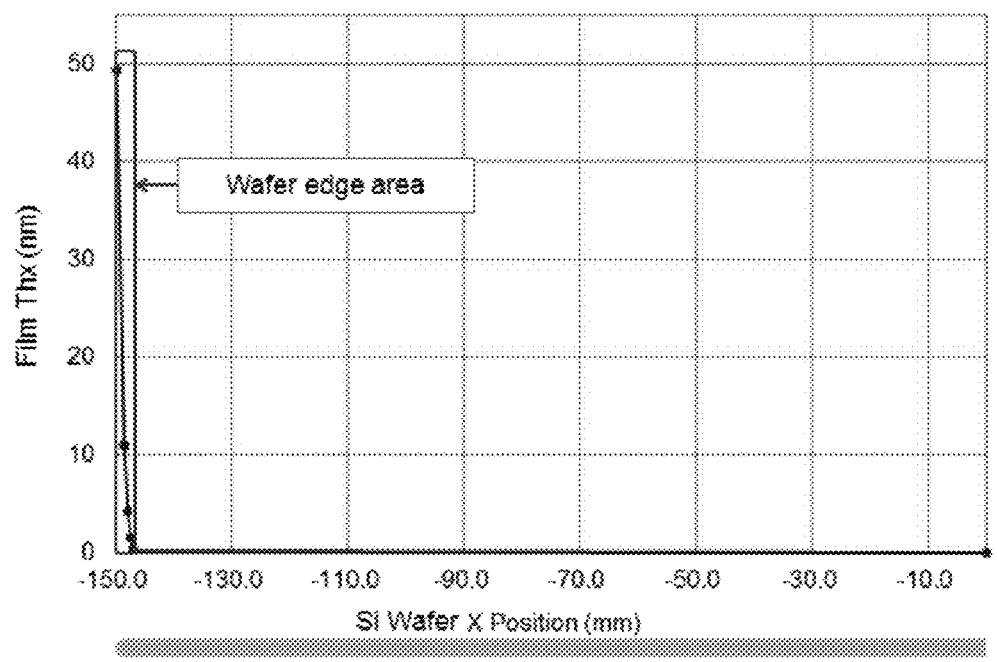
FIG. 9 is a graph showing a thickness distribution of a film deposited on a substrate according to an embodiment of the present invention.

FIG. 9 is a graph showing the thickness distribution of the film deposited on the substrate. As shown in FIG. 9, the bevel film has a maximum thickness at the tip of the substrate and becomes thinner toward the center of the substrate and becomes zero at a location about 3 mm inside from the tip of the substrate.

Next, the substrate with the bevel film is loaded to an end effector illustrated in FIG. 1 and clamped using push rollers. FIG. 8(*b*) illustrates a particle distribution on the backside of the substrate after the substrate is transferred using a mechanical clamp. As shown in FIG. 8(*b*), substantially no particles are detected on the backside of the substrate. FIG. 8(*a*) illustrates a particle distribution on the backside of a substrate after the substrate is transferred using a mechanical clamp, wherein the bevel portion of the substrate is not treated (no bevel film is formed).

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. An apparatus for plasma-enhanced CVD, comprising: upper and lower conductive electrodes, between which a substrate is loaded, said upper and lower conductive electrodes being arranged so that a plasma is generated only over or at a bevel portion of the substrate, wherein the upper and lower conductive electrodes radially extend in parallel to the substrate beyond the entire periphery of the substrate, and a gas nozzle or nozzles are arranged at or near a center of the upper conductive electrode.

2. The apparatus according to claim 1, wherein the upper and lower conductive electrodes extend over an area of the substrate between the bevel portion and the center of the substrate, and a distance between the upper and lower conductive electrodes over or at the bevel portion of the substrate is set for generating a plasma, whereas a distance between the upper and lower conductive electrodes over the area of the substrate between the bevel portion and the center of the substrate is too great or too small for generating a plasma.

3. The apparatus according to claim 1, wherein the upper conductive electrode is ring-shaped and set over or at the bevel portion of the substrate.

* * * * *